United States Patent [19]

Yarbrough

[11] 4,106,095

[45] Aug. 8, 1978

[54] ELECTRICAL USAGE DISPLAY SYSTEM

[75] Inventor: Grover A. Yarbrough, Lewisville, Tex.

[73] Assignee: Electronic Data Systems, Inc., Dallas, Tex.

[21] Appl. No.: 801,721

[22] Filed: May 31, 1977

[51] Int. Cl.² .................. G01R 13/00; H04M 11/04
[52] U.S. Cl. .................. 364/464; 324/103 R; 340/178; 364/483
[58] Field of Search .......... 235/151.3, 151.31, 151.21, 235/92 EL, 92 FL; 324/103 R, 113–116, 119; 340/150, 151, 152 R, 178, 248 R; 364/464, 480, 481, 483

[56] References Cited

U.S. PATENT DOCUMENTS

| | | | |
|---|---|---|---|
| 796,033 | 8/1905 | Duncan | 324/116 |
| 796,034 | 8/1905 | Duncan | 324/116 |
| 796,035 | 8/1905 | Duncan | 324/116 |
| 796,040 | 8/1905 | Duncan | 324/116 |
| 875,238 | 12/1907 | Boyce | 324/153 |
| 1,121,121 | 12/1914 | Murray | 324/103 |
| 1,138,513 | 5/1915 | Stempel | 324/116 |
| 2,039,863 | 5/1936 | Williams | 324/103 |
| 2,841,331 | 7/1958 | Starr et al. | 364/493 |
| 3,502,980 | 3/1970 | Baggott | 324/103 |
| 3,666,928 | 5/1972 | Burke et al. | 235/92 FL |
| 3,683,343 | 8/1972 | Feldman et al. | 324/116 |
| 3,747,068 | 7/1973 | Bruner et al. | 235/151.31 |
| 3,770,069 | 11/1973 | Loshbough | 177/1 |
| 3,809,866 | 5/1974 | Scoville | 235/92 FL |
| 3,822,400 | 7/1974 | Dunkel | 324/103 R |
| 3,962,570 | 6/1976 | Loshbough et al. | 177/25 |
| 4,002,890 | 1/1977 | Welin | 235/151.3 |
| 4,022,977 | 5/1977 | Nomura | 235/151.31 |

Primary Examiner—Malcolm A. Morrison
Assistant Examiner—Errol A. Krass
Attorney, Agent, or Firm—Richards, Harris & Medlock

[57] ABSTRACT

The specification discloses a system for displaying a cumulative indication of the estimated cost of electrical usage in a dwelling wherein electricity is applied through an electrical supply main. A coil is inductively coupled to the supply main for generating a signal representative of the magnitude of current passing through the supply main into the dwelling. The signal is rectified and amplified and is applied to an analog-to-digital converter which periodically samples the signal to generate digital signals. Input switches are operable by the consumer in order to provide a rate indication representative of the cost of the electricity flowing through the supply main. A calculator circuit is responsive to the digital signals from the analog-to-digital converter and is responsive to the rate indication from the input switches in order to periodically calculate an estimated cost of electricity passing through the supply main at the time of sampling during a preceding period. Storage circuits are connected to the calculator circuit in order to accumulate the calculated estimated cost for successive periods. A display is connected to the storage circuits for displaying the accumulated estimated cost of electricity passing through the supply main in order to assist the consumer in monitoring his energy usage.

28 Claims, 2 Drawing Figures

ELECTRICAL USAGE DISPLAY SYSTEM

FIELD OF THE INVENTION

This invention relates to a device for assisting in the monitoring of electricity usage, and more particularly relates to a display for displaying to the consumer an accumulated estimated cost of the consumer's electricity usage.

THE PRIOR ART

The rising cost and scarcity of electrical energy is an ever increasing problem. While systems are currently being developed to increase the efficiency of the use of electricity, it is also being recognized that it is important that the average consumer begin to conserve energy by reducing his use of electricity and other energy sources. Currently, the average consumer receives a monthly statement of his costs from the electrical utility company for electricity which has already been used. Consequently, the consumer is not able to continuously monitor his use of electricity, and is only aware of his usage of electricity on a monthly basis after the electricity has been used. In addition, it is thus difficult for a consumer to anticipate the magnitude of an upcoming statement for his use of electricity which makes it difficult for the consumer to budget for this expense. Because the average consumer cannot continuously monitor his actual electrical usage, the consumer is not able to take steps to reduce his electricity usage on a real time basis.

In the early days of providing electrical power to dwellings, mechanical meters were sometimes connected to the power main in order to provide an indication of the cost of the electricity consumed in terms of dollars and cents. Such mechanical meters were generally required to be interconnected directly into the power mains and required somewhat cumbersome mechanical metering devices which were expensive and subject to wear and maintenance problems. Such prior mechanical systems were also not adaptable to be remotely located from the supply mains in order to be disposed in a convenient location within the dwelling. Examples of such prior early mechanical electric meters may be found in the Duncan U.S. Pat. Nos. 796,033; 796,034; 796,035 and 796,040, all issued in 1905.

Other mechanical electric meters are disclosed in the Boyce Patent No. 875,238 and the Williams U.S. Pat. No. 2,039,863. A meter providing cost information to a consumer is disclosed in the Feldman et al. U.S. Pat. No. 3,683,343, but the Feldman et al. Patent discloses a complex system which requires the transmission of a multi-tone control code throughout the entire electrical distribution system.

A need has thus arisen for a monitoring system which will provide management information to a consumer so that the consumer may intelligently take action to conserve electrical energy and to immediately realize the results of such action. Such a system should also provide a representative indication of the amount of an upcoming electrical bill. The device should be relatively compact, inexpensive to operate and not subject to maintenance and repair problems, and should be able to be located remotely from the utility meter and supply mains at convenient locations within a dwelling. The device should provide accumulated indications of the total estimated cost of electrical energy usage over a selected period, yet be easily resettable to enable the consumer to collect cost data over a new monitoring period. The device should allow for the input of a rate for the cost of electricity, and allow for selected changes in the rate of cost.

SUMMARY OF THE INVENTION

The present invention contemplates a system which substantially reduces or eliminates the problems heretofore associated with prior art metering systems and which provides a monitoring system which will enable the consumer to continuously monitor his usage of electricity.

In accordance with the present invention, a system is provided to display a cumulative indication of electricity usage to a consumer. A sensor is provided to be disposed adjacent an electrical supply line for generating a signal representative of the current flowing through the electrical supply line. Circuitry periodically generates digital signals representative of the magnitude of the signal. A computer generates periodic output signals representative of a cumulative number of the digital signals. A display is connected to the computer for displaying to the consumer a cumulative indication of the electricity usage.

In accordance with yet another aspect of the invention, a system is provided for displaying a cumulative indication of the cost of electrical usage to a consumer. A sensor is disposed adjacent an electrical power line for generating a signal representative of the electricity flowing through the power main. Switches are operated to generate an input rate indication representative of the cost of electricity. A computing circuit is responsive to samples of the signal and to the input rate indication for periodically calculating an estimated cost of electricity used at the time of sampling during a preceding period. Storage circuitry is connected to the computer for accumulating the calculated estimated cost for successive periods. A display is connected to the storage circuitry for displaying to the consumer an accumulated estimated cost of electrical usage.

In accordance with yet another aspect of the present invention, a system is provided which displays a cumulative indication of the cost of electrical usage in a dwelling which has an electrical supply main. A coil is inductively coupled to the supply main for generating a signal representative of the magnitude of current passing through the supply main to the dwelling. An analog-to-digital converter is connected to the coil for periodically sampling the signal to generate digital signals. Input switches are operable to provide a rate indication representative of the cost of the electricity. Calculating circuitry is responsive to the digital signals and the rate indication for periodically calculating an estimated cost of electricity passing through the supply main at the time of sampling during a preceding period. Storage circuitry is connected to the calculating circuitry for accumulating the calculated estimated cost for successive periods. A display is coupled to the storage circuitry for displaying the accumulated estimated cost of electricity passing through the supply main.

DESCRIPTION OF THE DRAWINGS

For a more complete understanding of the present invention and further objects and advantages thereof, reference is now made to the following description taken in conjunction with the accompanying drawings, in which.

DESCRIPTION OF THE PREFERRED EMBODIMENTS

Figure 1:
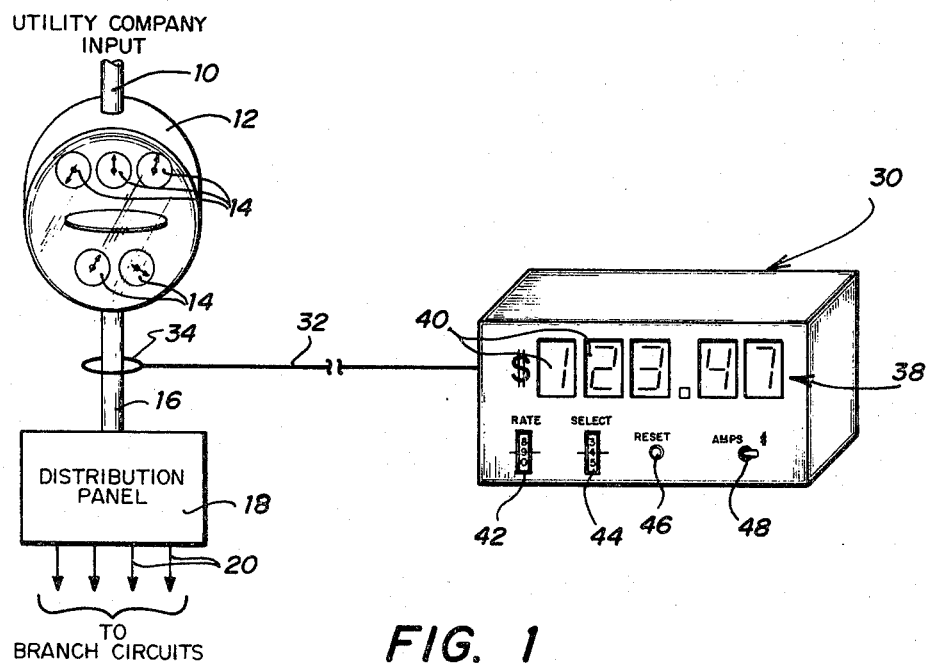
FIG. 1 is a perspective view of an electricity consumption monitor display system illustrating the interconnection between the system and the electrical supply means of a dwelling in accordance with the present invention.

Referring to FIG. 1, a perspective view of the present electricity consumption monitor display system is shown. FIG. 1 illustrates the use of the system to monitor the overall electricity consumption in a dwelling. However, as will be subsequently described, the system of the present invention can also be utilized to monitor electricity consumption and the estimated cost of such consumption for individual electrical appliances such as televisions, air conditioners and refrigerators.

Electricity is supplied from a utility company input along electrical supply main 10 to a dwelling of a consumer. A utility meter 12 having a plurality of electrical power consumption rate indicators 14 is disposed in series with the supply main 10 to measure the electrical power used by the consumer. The utility company in turn uses this meter to calculate the power consumption of the consumer and the resulting cost to the consumer. The utility meter displays power consumption in terms of kilowatt hours and does not present to the consumer a cost estimate of the electricity being consumed. By using the present invention, the consumer is presented with an estimated cost of electricity consumed over a selectable period of time to enable real time monitoring of electricity usage in an attempt to conserve energy.

The utility meter 14 is interconnected through a distribution supply main 16 to a dwelling electricity distribution panel 18. The distribution panel 18 provides the required circuitry for routing electricity along distribution lines 20 to the various branch circuits throughout the household.

The electricity consumption monitor display console unit, generally identified by the numeral 30, is interconnected using signal line 32 to an inductive coil 34. The inductive coil 34 is disposed adjacent the electrical supply main 16 and generates an AC signal representing the magnitude of current passing through the supply main 16 into the distribution panel 18. Alternatively, a conventional ammeter probe can be utilized to sense the current flowing in supply main 16. It will be understood that the signal line 32 can be of any desired length such that the console unit 30 can be positioned in any location within the dwelling for convenient observation by the consumer. Signal line 32 may comprise a twisted pair of conductors to eliminate any stray inductive fields which may introduce noise into the system. Alternatively, a shielded cable may be utilized for the signal line 32. In those environments in which stray inductive 60 cycle fields present a critical problem, the AC signal from the inductive coil 34 may be converted to an asynchronous signal and then transmitted to the console unit 30 to eliminate noise within the system. In this latter embodiment, a standard asynchronous transmitter and receiver would be included within the circuitry of the monitor display system.

The console unit 30 includes a display 38 comprising an array of light emitting diodes. The display 38 includes five, seven-segment light emitting diodes 40 to display to the consumer the estimated cost of electricity consumed during a particular time interval. The console unit 30 further includes rate select switches 42 and 44, which may comprise, for example, thumb wheel switches. Switches 42 and 44 are operable by the consumer to select and input into the console unit 30 the cost figure of electricity, per kilowatt hour, being charged by the utility company. This rate input by the consumer will be utilized in the mathematical computations performed within the console unit 30 to calculate the estimated cost of electricity consumed. If desired, additional thumbwheel switches may be provided to enable costs for fuel adjustment to be input into the system.

The console unit 30 further includes a reset push button switch 46. Push button switch 46 is used to reset the display of the console unit 30. In this manner, the consumer can observe the accumulative estimated cost of electricity used over selected time periods or over an extended time period. For example, the consumer can utilize the present system to monitor the additional energy consumed and the added cost of such usage during the viewing of a one hour television program or the use of an air conditioner for particular hours during a day. Of course, normally the system would probably be used to accumulate estimated costs for a one month period. The console unit 30 further includes a function select switch, such as the toggle switch 48. Toggle switch 48 is operable by the consumer to control the display 38 to display either the estimated cost of electricity consumed when placed in the position as shown in FIG. 1, or to permit the display 38 to display an accumulative indication of the ampere hours usage of electricity.

Figure 2:
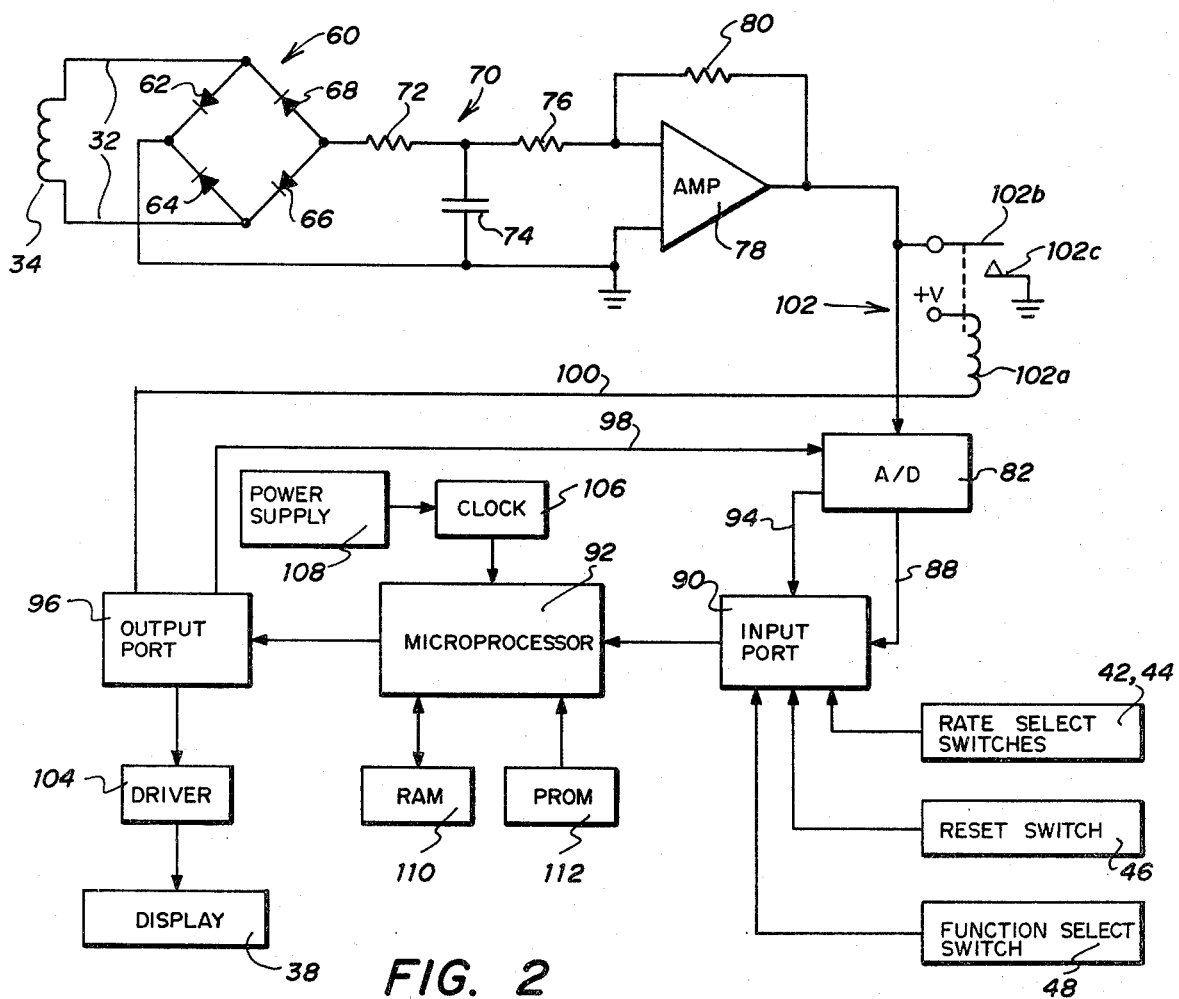
FIG. 2 is a detailed block diagram of the present system.

Referring to FIG. 2, a detailed block diagram of the electronic circuitry contained within the console unit 30 is illustrated. The inductive coil 34 is interconnected via signal lines 32 to a rectifier bridge circuit, generally identified by the numeral 60. Rectifier bridge circuit 60 includes diodes 62, 64, 66 and 68, which are interconnected to form a standard AC to DC voltage rectifier. The output of the inductive coil 34 produces an analog signal that is representative of the magnitude of current flowing in the supply main 16 (FIG. 1). The output of the inductive coil 34 is applied to the junction between diodes 62 and 68, and is applied to the junction between diodes 64 and 66. The magnitude of this output is approximately 20–50 millivolts. The rectified output of the AC signal which corresponds to a varying DC level corresponding to the AC signal amplitude from the inductive coil 34 is tapped from the junction between diodes 68 and 66, and diodes 62 and 64.

The rectified signal from rectifier 60 is applied to an integrating network, generally identified by the numeral 70. Integrating network 70 includes a resistor 72 and a capacitor 74 and functions as a filter to eliminate transient components in the rectified output signal from the inductive coil 34. The output of integrating network 70 is applied through a resistor 76 to an amplifier 78. A biasing resistor 80 is interconnected between the output of amplifier 78 and the noninverting input to amplifier 78. The output of amplifier 78 is applied to an analog-to-digital converter 82. Analog-to-digital converter 82 is a monolithic converter and may comprise, for example, model 8701 manufactured and sold by Teledyne Corporation.

The value selected for resistor 80 is such that the maximum gain of amplifier 78 is below the oscillating point of the amplifier 78. Resistor 76 functions as a gain control for the amplifier 78 to insure that the range of the input signal to amplifier 78 matches the operating range of the analog-to-digital converter 82. The value selected for resistor 76 depends upon the particular analog-to-digital converter 82 utilized in the circuitry and is a matter of design choice.

The converted output of the analog-to-digital converter 82 is applied along signal line 88 to an input port 90 of a microprocessor 92. A conversion complete signal is generated by the analog-to-digital converter 82 and is applied to the input port 90 along signal line 94 from the analog-to-digital converter 82. The input port 90 also receives signals from the rate select switches 42 and 44, the reset switch 46 and the function select switch 48. The input port 90 comprises a set of integrated circuits that permit information from the analog-to-digital converter 82 and the switches 42, 44, 46 and 48 to be individually input into the microprocessor 92 under the control and direction of the microprocessor 92.

Microprocessor 92 in the preferred embodiment is a single chip, 8-bit, n-channel microprocessor and may comprise, for example, an ISP-8A/600 SC/MP-II manufactured and sold by National Semiconductor Corporation. For a detailed functional description, operating characteristics and programming information of the microprocessor 92, reference is made to the technical data sheet entitled "ISP-8A/600 single-chip 8-bit n-channel microprocessor (SC/MP-II)" publication No. 426305290-001B (March, 1977) published by National Semiconductor Corporation, which is incorporated herein by reference. The output of microprocessor 92 is applied to an output port 96, which includes a set of integrated circuits that permit internal information generated by the microprocessor 92 to be directed outward from the microprocessor 92 at preselected times selected and controlled by the microprocessor 92.

Output signals from the output port 96 include a convert command signal applied along signal line 98 to the analog-to-digital converter 82. The convert command signal enables the analog-to-digital converter 82 to perform the conversion of the amplified analog input signal to a digital signal. A second output from output port 96 is applied along signal line 100 to a relay, generally identified by the numeral 102. The function of relay 102 serves to provide auto-zeroing as will be subsequently described. The third output of output port 96 is applied to display driver circuitry 104, which includes the necessary amplifiers and related circuitry to control the operation of display 38. The operation of the driver 104 and light emitting diode display 38 is well known in the art.

Microprocessor 92 is cycled under the command of clock circuitry 106, which is powered from a power supply 108. The input to clock circuitry 106 comprises a 60 Hz input. The clock circuitry 106 performs a divide-by-60 function such that it provides a one trigger pulse per second to the microprocessor 92.

Interconnected to the microprocessor 92 is random access memory 110 which may comprise, for example, a 2101 RAM manufactured and sold by National Semiconductor Corporation. RAM 110 functions as a register to temporarily store the accumulated value of cost or ampere hours measured for input into the microprocessor 92 for each subsequent calculation. Microprocessor 92 is also interconnected to a programmable read only memory 112. Programmable read only memory 112 is an nonerasable PROM, 8-bit by 256 words and may comprise, for example, a 5203Q PROM manufactured and sold by National Semiconductor Corporation. PROM 112 contains the firmware for control of the microprocessor 92.

Operation of the present electricity consumption monitor display system will now be described with reference to the cycle steps performed by the microprocessor 92. The analog signal representative of the magnitude of current is sensed by the inductive coil 34, rectified by the rectifier bridge 60 and is filtered by the integration network 70. The filtered signal is then applied to amplifier 78 for amplification of the rectified analog signal prior to application to the analog-to-digital converter 82. Because current is being sensed by the inductive coil 34, the present system does not measure power consumed and therefore does not display the exact cost of power consumed by the user. However, measurement of current by the system does provide a quantity proportional to the power consumed and will provide the consumer with an estimated cost of the electricity used over a period of time. The actual difference between the utility company measured cost of power consumed and that displayed by the present invention is due to the presence of inductive loads within the dwelling of the user, caused by operation of, for example, motors, refrigerators and air conditioners. However, where these inductive loads are at a minimum, voltage and current will be in phase such that the power factor will approach unity. In this case, the cost of electricity consumption monitored by the present system will very closely approximate the actual cost of consumption as measured by the utility company. Therefore, it can be seen that the present invention does not measure actual power consumed to display the cost of power consumed, but displays an estimated cost of electricity consumed. Although the consumer will not be able to exactly compare the cost displayed by the present system with his utility bill, he will have an accurate estimation in real time of the additional costs involved to operate an electric appliance and the incremental costs involved in continued use of appliances.

During each one second time interval as clocked by the clock circuitry 106, the microprocessor 92 receives information through the input port 90 from the analog-to-digital converter 82, and rate switches 42 and 44. Microprocessor 92 performs the multiplication of the rate times the digital signal representing current consumed within the one second time interval and accumulates this value with the previously stored value in RAM 110. The accumulated value is then displayed on the display 38.

At the beginning of each one second cycle and under the control of the microprocessor 92 a signal will be generated from the output port 96 via signal line 98 to command the analog-to-digital converter 82 to perform a conversion. The microprocessor 92 will then substantially instantaneously sample at its input port 90 the conversion complete signal via signal line 94 to determine whether the converted analog signal is available at the output of analog-to-digital converter 82 at signal line 88. Upon receipt of the conversion complete signal, the microprocessor 92 will read in the converted analog signal from the analog-to-digital converter 82. The microprocessor 92 thus effectively samples the magnitude of the analog signal once during each 1 second period. The next step of the microprocessor cycle will be to read in through the input port 90 the value of the rate selected by positioning the rate select switches 42 and 44 for the consumption of power. The microprocessor 92 will then perform the multiplication of the rate times the value read in from the analog-to-digital converter 82 and accumulate this new value with the value previously stored in the RAM 110. This accumulation will take place both for the incrementation of ampere hours and the incrementation of dollars and cents representing the estimated amount of electricity consumed. The microprocessor 92 will then sample through the input port 90 whether the reset switch 46 has been actuated. The reset switch, if actuated, will clear all the registers in RAM 110 so that RAM 110 will begin accumulating either dollars and cents or ampere hours from zero during the next 1 second interval.

The next step in the cycle will be for the microprocessor 92 to sample the position of the function select switch 48 through the input port 90. The position of the function switch 48 will determine whether the output of microprocessor 92 through the output port 96 will be in terms of dollars and cents or ampere hours to be displayed on the display 38.

At the end of each cycle an error signal or offset correction signal is generated, which is applied from the analog-to-digital converter 82 through input port 90 to the microprocessor 92. This error correction signal is stored in RAM 110 for subsequent use on the next cycle to correct for analog drift and inconsistencies in the performance of the analog-to-digital converter 82. The error correction signal is generated through operation of the relay 102. Under the control of the microprocessor 92, an output signal is generated through the output port 96 along signal line 100 to energize the relay coil 102a of relay 102. Energization of relay coil 102a closes contact 102b and 102c to short the input of the analog-to-digital converter 82. By shorting the input to converter 82 to ground there is a zero volt input signal applied to the converter 82. The microprocessor 92 then samples the output of the analog-to-ditigal converter 82 along signal line 88 through the input port 90 in the manner as described above had the input to the analog-to-digital converter 82 not been shorted. If the output value of the analog-to-digital converter 82 is zero, then no offset correction is required and the converter 82 is therefore operating correctly. However, if a value other than zero is output along signal line 88 this value is stored within the RAM 110 for use in the subsequent calculation on the next cycle of the microprocessor 92 to correct the accumulated sum due to error and the operation of the analog-to-digital converter 82. The magnitude of the error is preserved in RAM 110 and is then subtracted by the microprocessor 92 from the accumulated sum on the next subsequent cycle.

At the beginning of the next cycle, relay 102 opens to allow the output of amplifier 78 to be applied to the input of analog-to-digital converter 82. The use of the relay 102 provides for an automatic zeroing of the analog-to-digital converter 82 on each cycle of operation. Thus, an error correction value can be generated for each cycle to improve the accuracy of the calculations performed by the microprocessor 92. The temporary value of the offset correction signal will be stored in the RAM 110 for subsequent calculation by the microprocessor 92. Because the microprocessor 92 completes each cycle once every second, the display 38 will be updated each one second time interval to display either the estimate of the accumulated cost of electricity consumed in dollars and cents or the accumulated amount of current consumed depending upon the function selected through the switch 48.

To summarize the operating cycle of the microprocessor 92, it can be seen that prior to each cycle, the input to the analog-to-digital converter 82 is shorted through the operation of relay 102. The error correction signal is then generated and is applied through the input port 90 to the microprocessor 92 for storage within RAM 110. At the initiation of the one second trigger to the microprocessor 92 by the clock circuitry 106, the analog-to-digital converter 82 receives the convert command from the output port 96 along signal line 98. The microprocessor 92 then receives the conversion complete signal via signal line 94 through the input port 90 which instructs the microprocessor 92 to read in the converted analog signal from the analog-to-digital converter 82 via signal line 88. Microprocessor 92 then reads in through the input port 90 the value of the rate for the power consumed as selected by the consumer using rate select switches 42 and 44. The microprocessor 92 then performs the necessary multiplication using these two input values and accumulates within the RAM 110 the updated cost figure or amperes measured during the 1 second cycle. The microprocessor 92 then reads in the condition of the reset switch 46 and function select switch 48. The condition of these switches is applied through the output port 96 to driver circuitry 104 to actuate the display 38 and display the estimated cost of electricity consumed or ampere hours consumed to the user of the present system.

Although the present invention has been described as measuring current passing through an electrical supply main applying electricity for a dwelling, it will be apparent that the invention may also be used to measure current consumption by a single appliance. To accomplish this, a plug is provided which is plugged in series with the electrical supply cord of the appliance. The plug isolates the two wires in the supply cord and includes a coil which senses the current passing through one of the wires. The housing 30 is attached to the plug by the wire 32 in the manner previously described.

It can therefore be seen that the present invention provides for a monitoring system which will provide management information to a consumer so that the consumer may intelligently take action to conserve electrical energy and to measure the results of such action. The system can be utilized to monitor the overall consumption of electricity by a consumer in a dwelling or alternatively can be used to monitor the cost of operating an individual appliance. The present system is relatively compact, inexpensive to operate and is not subject to maintenance and repair problems to provide a consumer with an estimated cost of the consumer's electricity usage.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A system for displaying a cumulative indication of electricity usage to a consumer comprising:
    inductive coil means for being disposed adjacent an electrical supply line for generating a signal representative of the current flowing through the electrical supply line;

means for periodically generating digital signals representative of the magnitude of said signal;

computing means for receiving said digital signals and for generating periodic output signals representative of a cumulative number of said digital signals; and display means connected to said computing means for displaying to the comsumer a cumulative indication of the electricity usage.

2. The system of claim 1 wherein said means for periodically generating digital signals comprises an analog-to-digital converter.

3. The system of claim 1 and further comprising: means for inputting an indication of the cost of electricity to said computing means.

4. The system of claim 3 wherein said cumulative indication of the electricity usage comprises the cumulative estimated cost of the electricity usage.

5. The system of claim 1 wherein said computing means comprises a microprocessor.

6. The system of claim 1 wherein said cumulative indication comprises a cumulative indication of the magnitude of electrical amperes flowing through the electrical supply line.

7. A system for displaying a cumulative indication of the cost of electrical usage to a consumer comprising:

sensing means for being disposed adjacent an electrical power line for generating a signal representative of the electrical current flowing through the power line;

means for generating an input rate indication representative of the cost of electricity;

computing means responsive to said signal and said input rate indication for periodically calculating an estimated cost of electricity used during a preceeding period;

storing means connected to said computing means for accumulating the calculated estimated costs for successive periods; and a display coupled to said storing means for displaying to the consumer an accumulated estimated cost of electrical usage.

8. The system of claim 7 wherein said sensing means comprises an inductive coil.

9. The system of claim 7 wherein said means for generating an input rate indication representative of the cost of electricity comprises switch means operable by the consumer.

10. The system of claim 7 wherein said computing means comprises a programmable microprocessor.

11. The system of claim 10 and further comprising: a programmable read only memory connected to said programmable microprocessor to control the operation of said microprocessor.

12. The system of claim 11 and further comprising: a random access memory connected to said programmable microprocessor for accumulating the estimated costs.

13. The system of claim 7 and further comprising: an analog-to-digital converter connected between said sensing means and said computing means.

14. The system of claim 13 and further comprising: rectifying means connected between said sensing means and said analog-to-digital converter.

15. A system for displaying a cumulative indication of the cost of electrical usage in a dwelling having an electrical supply main comprising:

coil means for being inductively coupled to the electrical supply main for generating a signal representative of the magnitude of current passing through the electrical supply main to the dwelling;

an analog-to-digital converter connected to said coil means for periodically sampling said signal to convert said signal to digital signals;

input means operable to provide a rate indication representative of the cost of the electricity;

calculating means responsive to said digital signals and said rate indication for periodically calculating an estimated cost of electricity passing through the supply main at the time of sampling during a preceding period;

storage means connected to said calculating means for accumulating the estimated costs for successive periods; and a display coupled to said storage means for displaying the accumulated estimated cost of electricity passing through the electrical supply main.

16. The system of claim 15 wherein said input means comprises switch means settable by an operator.

17. The system of claim 15 wherein said calculating means comprises a programmable digital microprocessor.

18. The system of claim 15 wherein said storage means comprises a random access memory connected to said microprocessor for accumulating the estimated costs.

19. The system of claim 18 and further comprising: a programmable read only memory connected to said programmable digital microprocessor to control the operation of said microprocessor.

20. The system of claim 19 and further comprising: rectifying means connected between said coil means and said analog-to-digital converter.

21. The system of claim 20 and further comprising: a filter connected between said rectifying means and said analog-to-digital converter.

22. The system of claim 21 and further comprising: an amplifier connected between said filter and said analog-to-digital converter.

23. The system of claim 15 wherein said display comprises an array of light emitting diodes.

24. The system of claim 15 wherein said display displays estimated costs in dollars and cents.

25. The system of claim 15 and further comprising: means for accumulating indications of amperes of current passing through the supply main; and means operable to display the accumulated indications of amperes on said display.

26. The system of claim 15 and further comprising: reset means operable to reset the contents of said storage means to zero.

27. The system of claim 15 and further comprising: an elongated wire extending from said coil means to a housing containing said analog-to-digital converter, said input means, said calculating means, said storage means and said display.

28. The system of claim 27 wherein said housing is located within the dwelling remote from said coil means.

* * * * *